(12) United States Patent
Choe

(10) Patent No.: US 6,714,059 B1
(45) Date of Patent: Mar. 30, 2004

(54) HIGH-SPEED DOMINO LOGIC CIRCUIT

(75) Inventor: Swee Yew Choe, Milpitas, CA (US)

(73) Assignee: Sun Microsystems, Inc., Santa Clara ( * ) Notice: Subject to any disclaimer, the term of this patent is extended or adjusted under 35 U.S.C. 154(b) by 0 days.

(21) Appl. No.: 10/354,492

(22) Filed: Jan. 30, 2003

(51) Int. Cl.$^7$ .......................... H03K 3/037; H03K 3/12; H03K 3/286; H03K 3/356
(52) U.S. Cl. ....................... 327/200; 327/211; 327/212; 326/98; 326/121; 326/122
(58) Field of Search ................ 327/199–201, 327/208, 210, 211, 212, 214, 225; 326/95–98, 112, 119, 121, 122

(56) References Cited

U.S. PATENT DOCUMENTS

| | | | |
|---|---|---|---|
| 4,247,791 A | | 1/1981 | Rovell .......................... 327/52 |
| 5,859,548 A | | 1/1999 | Kong .......................... 326/113 |
| 6,028,454 A | | 2/2000 | Elmasry et al. ............. 326/115 |
| 6,043,696 A | * | 3/2000 | Klass et al. ................. 327/211 |
| 6,087,872 A | * | 7/2000 | Partovi et al. .............. 327/201 |
| 6,211,704 B1 | | 4/2001 | Kong .......................... 326/121 |
| 6,404,235 B1 | * | 6/2002 | Nowka et al. ................ 326/96 |

OTHER PUBLICATIONS

Choe et al., "Dynamic Half Rail Differential Logic for Low Power", IEEE 1997, pp. 1936 to 1939.
Jung et al., "Modular Charge Recycling Pass Transistor Logic (MCRPL)", Electronics Letters, 2nd Mar. 2000 vol. 36 No.5, Mar. 2, 2000, pp. 404 to 405.
Kong et al., "Charge Recycling Differential Logic for Low–Power Application", ISSC96 secession 18, IEEE 0–780331962/98, 1998, pp. 302 to 448.
Choe et al., "Half Rail Differential Logic", ISSCC97/Secession 25/Processors and Logic/Paper SP 25.6 IEEE 0–7803–3721–2/97, 1997, pp. 420 to 421, 336 to 337 and 489.
Won et al., "Modified Half Rail Differential Logic for Reduced Internal Logic Swing", IEEE 0–7803–4455–3/98, 1998, pp. II–157 to II–160.
Kong et al., "Charge Recycling Differential Logic (CRDL) for Low–Power Application", IEEE Journal of Solid–State Circuits, vol. 31, No. 9, Sep. 1996, pp. 1267–1276.

* cited by examiner

Primary Examiner—Long Nguyen
(74) Attorney, Agent, or Firm—Gunnison, McKay & Hodgson, L.L.P.; Philip J. McKay

(57) ABSTRACT

An improved high-speed domino logic circuit uses two delayed clock signals, CLKD and CLKDBAR, and three transistors to introduce a transition delay time. According to the invention, the delayed clock signals are used in conjunction with the three added transistors to avoid the contest or "fight" between a first node and the keeper transistor in the event of a path to ground being created through the logic block portion of improved high-speed domino logic circuit. The improved high-speed domino logic circuits of the invention, in contrast to prior art domino logic circuits, can be designed to have high noise immunity and increased speed. In addition, since according to the invention, only three new transistors are required, the modification of the invention is space efficient and readily incorporated into existing designs.

12 Claims, 3 Drawing Sheets

HIGH-SPEED DOMINO LOGIC CIRCUIT

FIELD OF THE INVENTION

The present invention relates generally to logic circuits and, more particularly, to domino logic circuits.

BACKGROUND OF THE INVENTION

FIG. 1 shows a schematic diagram of one embodiment of a typical prior art domino logic circuit 100. As seen in FIG. 1, prior art domino logic circuit 100 included a first supply voltage 101, typically Vdd, coupled to a source, or first flow electrode 111, of a PFET 110 and a source, or first flow electrode 121 of a PFET 120, also known as a keeper transistor. The signal CLK was coupled to a control electrode or gate 115 of PFET 110 and a control electrode or gate 135 of an NFET 130. A drain, or second flow electrode 113, of PFET 110 was coupled to a first node 190. A drain, or second flow electrode 123, of PFET 120 was also coupled to first node 190 and an input terminal 107 of an inverter 105. An output terminal 109 of inverter 105 was coupled to a control electrode or gate 125 of PFET 120 and a prior art domino logic circuit out terminal 151.

Node 190 was coupled to an input terminal 102 of a logic block 103. Logic block 103 was comprised of any one of numerous types of logic and/or circuitry used in the art including various logic gates, logic devices and circuits such as transistors, inverters and other logic functions, both simple and complex, well known to those of skill in the art, and too numerous to list comprehensively herein. Logic block 103 also included inputs at input terminals 104 and an output terminal 108. Output terminal 108 of logic block 103 was coupled to a drain, or first flow electrode 131 of NFET 130. A source, or second flow electrode of NFET 133 was coupled to a second supply voltage 106, typically ground.

For illustrative purposes specific embodiments of prior art domino logic circuit 100 were shown with specific transistors. However, the NFETs and PFETS shown in the FIG. 1 can be readily exchanged for PFETs and NFETs by reversing the polarities of the supply voltages or by other well known circuit modifications.

Prior art domino logic circuit 100 had two modes, or phases, of operation; a pre-charge phase and an evaluation phase. In one embodiment of prior art domino logic circuit 100, in the pre-charge phase; the signal CLK was low or a digital "0". Consequently, PFET 110 was conducting or "on"; PFET 120 was on and NFET 130 was off, thereby isolating logic block 103 from second supply voltage 106. In addition, during the pre-charge phase, first node 190 was high, or a digital "1", and this state was reinforced by PFET 120 being in the on state. In addition, during the pre-charge phase, prior art domino logic circuit output terminal 151 was low or digital "0".

In the following discussion, assume that in the previous cycle, there was a path 191 from node 190 to second supply voltage 106 through logic block 103. In the evaluation phase, the signal CLK was high or a digital "1". Consequently, PFET 110 was not conducting or "off"; PFET 120 was on; and NFET 130 was on, thereby providing logic block 103 a path to second supply voltage 106. In addition, during the evaluation phase, first node 190 was low, or a digital "0" and prior art domino logic circuit output terminal 151 was high or digital "1".

Prior art domino logic circuit 100 functioned reasonably well in either low speed environments or low noise environments, however, prior art domino logic circuit 100 did not perform well in high speed and high noise applications. This was because, with prior art domino logic circuit 100, the transition from the pre-charge phase to the evaluation phase involved an inherent problem regarding first node 190 and PFET 120. This problem arose because, as discussed above, in the pre-charge phase, first node 190 of prior art domino logic circuit 100 was held at a digital "1" and prior art domino logic circuit output node 151 was a digital "0", which reinforced the digital "1" on first node 190 by keeping PFET 120 on. At the transition from pre-charge to evaluation phase, the signal CLK goes to a digital "1" and NFET 130 is turned on, consequently, logic block 103 is provided with a path to second source voltage 106. If, as was often the case in many instances and types of logic used in logic block 103, logic block 103 also provided a path to NFET 130 at this time, i.e., logic block 103 was also "on", then a path 191 from first node 190 (FIG. 1) to second supply voltage 106, typically ground, through logic block 103 and NFET 130 was established. Once path 191 was established, first node 190 should have dropped to a digital "0" as rapidly as possible to avoid delays in operation of prior art domino logic circuit 100. However, in this same time frame, PFET 120 was still transitioning to the off state, i.e., was still on, and this meant that PFET 120 was still trying to hold first node 190 at first supply voltage 101, i.e., at a digital "1". Consequently, in prior art domino logic circuit 100 there was an inherent "fight" between first node 190, trying to discharge to "0" and PFET 120 trying to hold first node 190 at "1" during the transition between pre-charge and evaluation. This fight resulted in a significant delay in the operation of prior art domino logic circuit 100.

To try and minimize this effect, i.e., the delay, resulting from the "fight" between first node 190, trying to discharge to "0" and PFET 120 trying to hold first node 190 at "1" during the transition between pre-charge and evaluation, most circuit designers employed a PFET 120 with the smallest possible channel dimensions, i.e., PFET 120 was intentionally made small, and therefore weak, so that PFET 120 would hold node 190 high for as short a time as possible. In other words, PFET 120 was made weak and small so it would lose its fight with first node 190 quickly. Unfortunately, this solution had significant drawbacks. In particular, by making PFET 120 small, the noise immunity of prior art domino logic circuit 100 was compromised and this could lead to total failure of prior art domino logic circuit 100 in high noise environments.

Employing a weak PFET 120 in prior art domino logic circuit 100 was particularly problematic in instances where logic block 103 did not provide a path to NFET 130 and second supply voltage 106. In these instances, first node 190 must remain high. However, if noise was introduced at input terminals 104 of logic block 103, this noise could cause logic block 103 to provide a temporary path to NFET 130 and second supply voltage 106. In this case, first node 190 could discharge to ground, i.e., first node 190 could go low in error, and there was no mechanism to ever bring first node 190 back to high or digital "1". Consequently, under these circumstances, prior art domino logic circuit 100 would fail unrecoverably.

As a result of the situation discussed above, designers of prior art domino logic circuit 100 were constantly involved in a balancing act between minimizing the size and strength of PFET 120, to increase speed of prior art domino logic circuit 100, and increasing the size and strength of PFET 120, to make prior art domino logic circuit 100 more robust and noise immune. The result was that prior art domino logic circuit 100 functioned reasonably well in either low speed environments or low noise environments, however, prior art domino logic circuit 100 did not perform well in high speed and high noise applications.

What is needed is a method and apparatus for creating an improved domino logic circuit that is capable of operation in both high speed and high noise environments.

SUMMARY OF THE INVENTION

The present invention is directed to a method and apparatus for creating an improved domino logic circuit that is capable of operation in both high speed and high noise environments.

The improved high-speed domino logic circuit of the invention uses two delayed clock signals, CLKD and CLKDBAR, and three additional transistors to introduce a transition delay time. According to the invention, delayed clock signals CLKD and CLKDBAR are used in conjunction with a new fourth transistor and a new combined pair of fifth and sixth transistors to avoid the fight between the first node and the second transistor described above.

According to the invention, the delayed clock signal CLKD remains a digital "0" for a programmed delay time, and delayed clock signal CLKDBAR remains high for a programmed delay time, while signal CLK immediately transitions to a digital "1". During this delay time between when signal CLK goes to a digital "1" and the delayed signals CLKD and CLKDBAR change state, the signal, a digital "1" on the improved high-speed domino logic circuit out terminal is isolated from a second node by the new combined pair of fifth and sixth transistors being off. At the same time, signal CLKD, still a digital "0", is coupled to a control electrode of the new fourth transistor and the new fourth transistor conducts to drive the control electrode of the second transistor to a digital "1", thus shutting off the second transistor. Consequently, the second transistor does not resist, compete or "fight" the discharge of the first node to a digital "0" when there is a path from the first node to the second supply voltage Since, according to the invention, the second transistor does not resist, compete or "fight" the discharge of the first node when there is a path from the first node to the second supply voltage, circuit designers are free to use larger and more powerful second transistors. This, in turn, means that the improved high-speed domino logic circuits of the invention, in contrast to prior art domino logic circuits, can be designed to have high noise immunity and increased speed.

In addition, since according to the invention, only three new transistors are required, the modification of the invention is space efficient and readily incorporated into existing designs.

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention and, together with the description, serve to explain the advantages and principles of the invention. In the drawings.

DETAILED DESCRIPTION

The invention will now be described in reference to the accompanying drawings. The same reference numbers may be used throughout the drawings and the following description to refer to the same or like parts.

Figure 1:
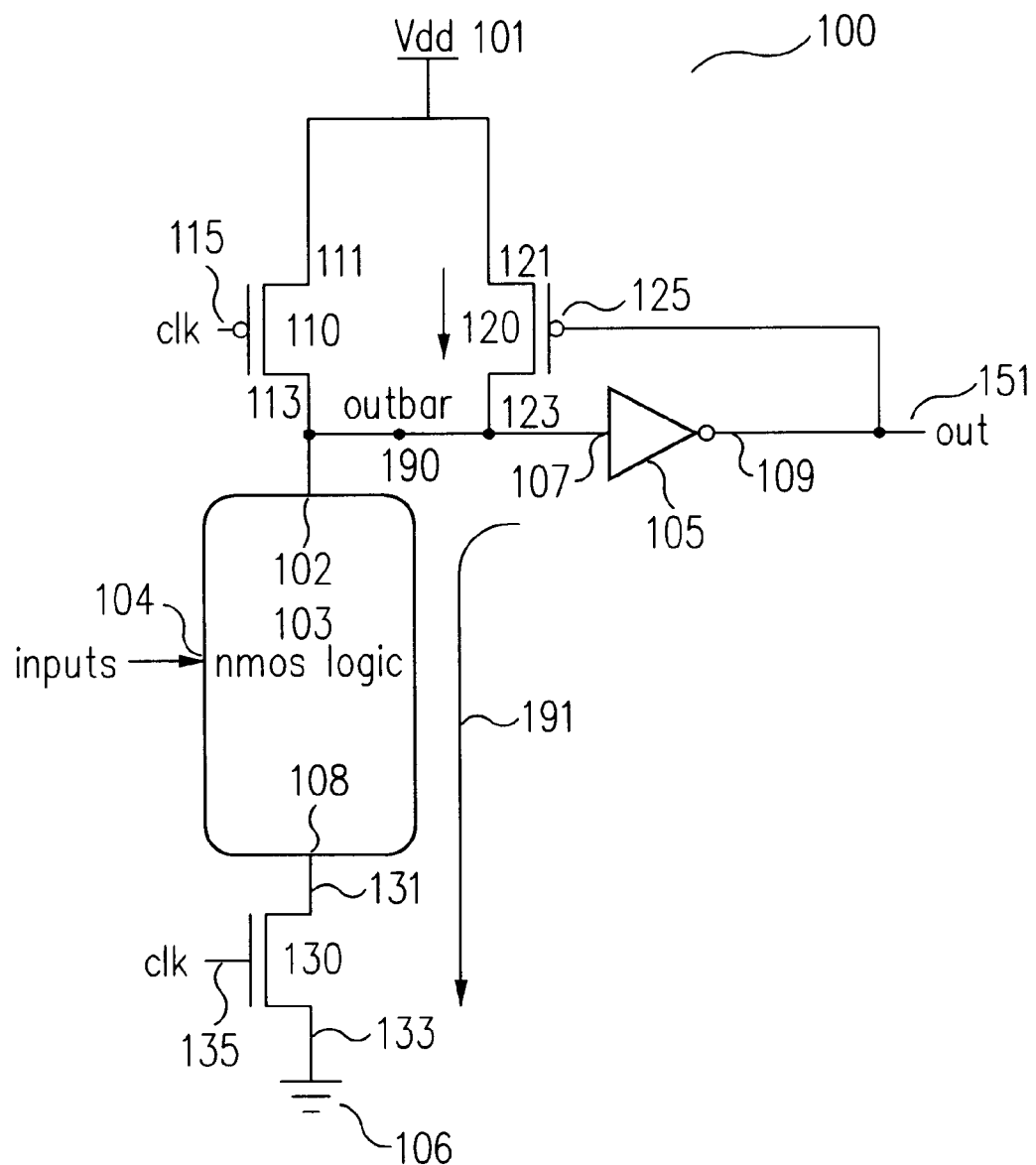
FIG. 1 shows a schematic diagram of a prior art domino logic circuit.
Figure 2:
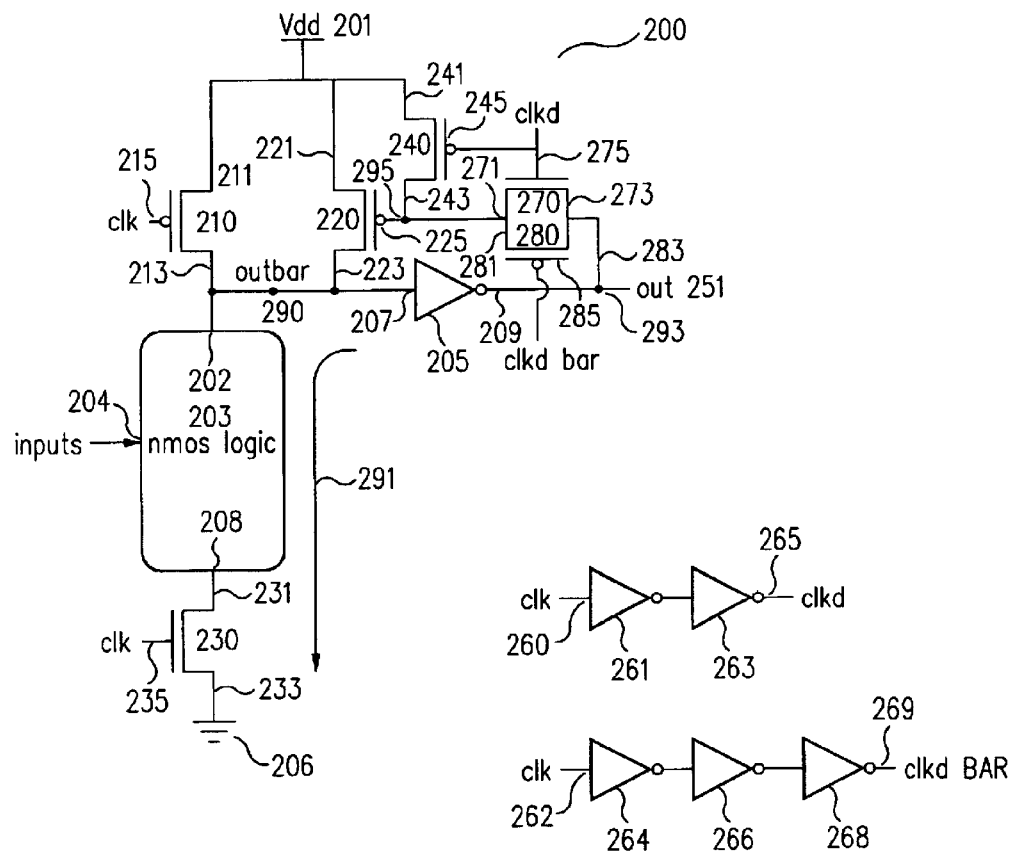
FIG. 2 shows a schematic diagram of one embodiment of an improved high speed domino logic circuit designed according to the principles of the present invention.
Figure 3:
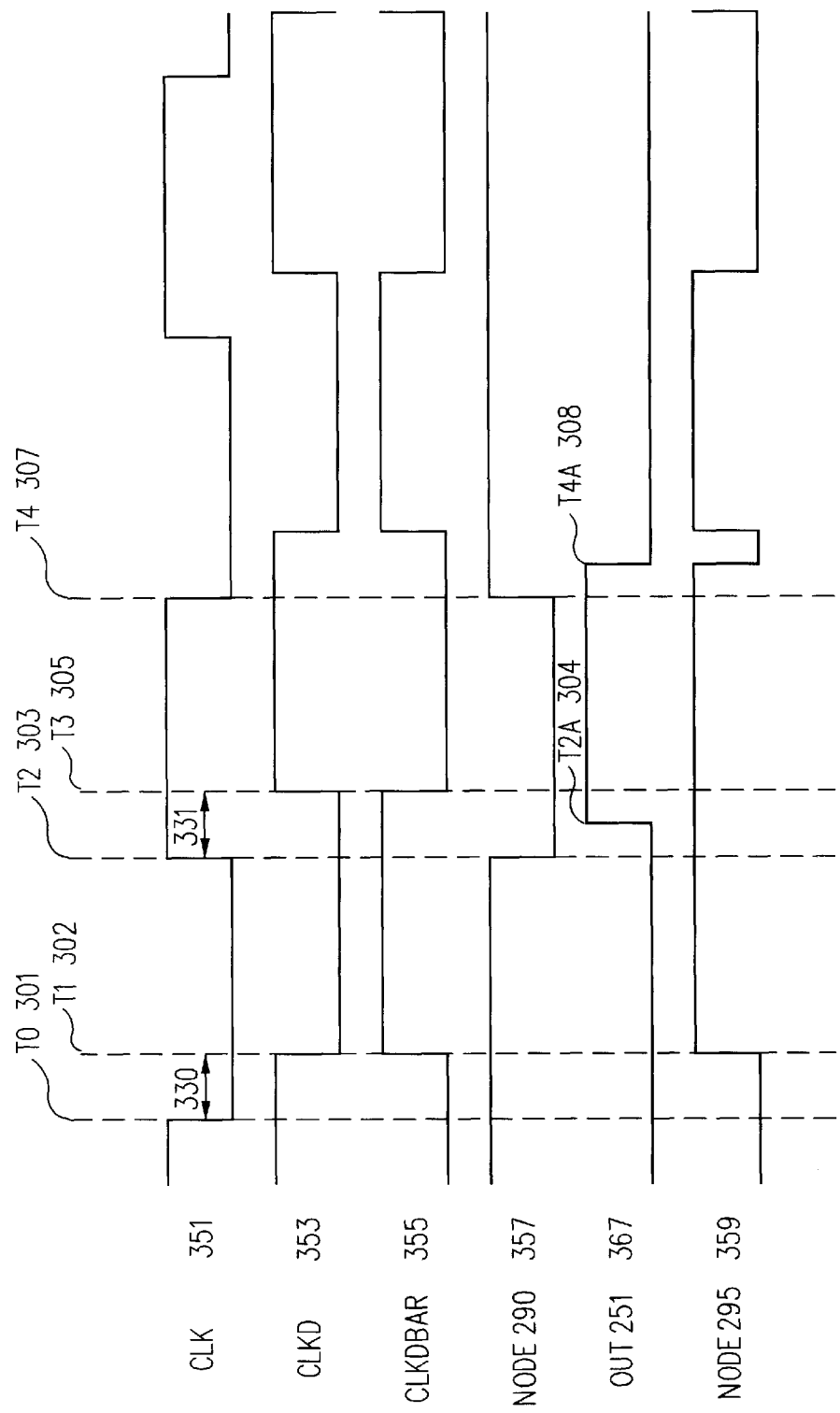
FIG. 3 is a one embodiment of a timing diagram for the improved high-speed domino logic circuit of the invention shown in FIG. 3.

The improved high-speed domino logic circuit of the invention uses two delayed clock signals, CLKD (353 in FIG. 3) and CLKDBAR (355 in FIG. 3), and three additional transistors (240, 270 and 280 in FIG. 2) to introduce a transition delay time (330 and 331 in FIG. 3). According to the invention, delayed clock signals CLKD and CLKDBAR are used in conjunction with a new fourth transistor (240 in FIG. 2)) and a new combined pair of fifth and sixth transistors (270 and 280 in FIG. 2) to avoid the fight between the first node (290 in FIG. 2) and the second transistor (220 in FIG. 2) described above (FIG. 1).

According to the invention, the delayed clock signal CLKD remains a digital "0" for a programmed delay time, and delayed clock signal CLKDBAR remains high for a programmed delay time, while signal CLK (351 in FIG. 3) immediately transitions to a digital "1". During this delay time between when signal CLK goes to a digital "1" and the delayed signals CLKD and CLKDBAR change state, the signal (367 in FIG. 3), a digital "1" on the improved high-speed domino logic circuit out terminal (251 in FIG. 2) is isolated from a second node (295 in FIG. 2) by the new combined pair of fifth and sixth transistors being off. At the same time, signal CLKD, still a digital "0", is coupled to a control electrode (245 in FIG. 2) of the new fourth transistor and the new fourth transistor conducts to drive the control electrode (225 in FIG. 2) of the second transistor to a digital "1", thus shutting off the second transistor. Consequently, the second transistor does not resist, compete or "fight" the discharge of the first node to a digital "0" when there is a path (291 in FIG. 2) from the first node to the second supply voltage (206 in FIG. 2).

Since, according to the invention, the second transistor does not resist, compete or "fight" the discharge of the first node when there is a path from the first node to the second supply voltage, through the logic block (203 in FIG. 2), circuit designers are free to use larger and more powerful second transistors. This, in turn, means that the improved high-speed domino logic circuits of the invention, in contrast to prior art domino logic circuits, can be designed to have high noise immunity and increased speed.

In addition, since according to the invention, only three new transistors are required, the modification of the invention is space efficient and readily incorporated into existing designs.

FIG. 2 shows a schematic diagram of one embodiment of an improved high-speed domino logic circuit 200 of the invention. As discussed in more detail below, according to the invention, two delayed clock signals are employed; CLKD and CLKDBAR. As shown in FIG. 2, signal CLKD is created by coupling signal CLK to an input terminal 260 of a circuit comprised of an even number of delay elements, 261 and 263 in FIG. 2, which results in the generation of an in-phase signal CLKD at terminal 265. Those of skill in the art will recognize the number of delay elements used can be varied to meet the needs of the application. However, an even number of elements is typically required to ensure signal CLKD is in-phase with signal CLK. As also shown in FIG. 2, signal CLKDBAR is created by coupling signal CLK to an input terminal 262 of a circuit comprised of an odd number of delay elements, 264, 266 and 268 in FIG. 2, which results in the generation of an out-of-phase signal CLKDBAR at terminal 269. Those of skill in the art will recognize the number of delay elements used can be varied to meet the needs of the application. However, an odd number of elements is typically required to ensure signal CLKDBAR is out-of-phase with signal CLK.

As seen in FIG. 2, improved high speed domino logic circuit 200 includes a first supply voltage 201, in one embodiment Vdd, coupled to a first flow electrode 211, of a first transistor 210 and a first flow electrode 221 of a second transistor 220, also known as a keeper transitory. The signal CLK is coupled to a control electrode 215 of first transistor 210 and a control electrode 235 of a third transistor 230. A second flow electrode 213 of first transistor 210 is coupled to a first node 290. A second flow electrode 223 of second transistor 220 is also coupled to first node 290 and an input terminal 207 of an inverter 205. An output terminal 209 of inverter 205 is coupled improved high-speed domino logic circuit out terminal 251.

First node 290 is coupled to an input terminal 202 of a logic block 203. Logic block 203 is comprised of any one of numerous types of logic and/or circuitry used in the art including various logic gates, logic devices and circuits such as transistors, inverters and other logic functions, both simple and complex, well known to those of skill in the art, and too numerous to list comprehensively herein. Logic block 203 also includes inputs at input terminals 204 and an output terminal 208. Output terminal 208 of logic block 203 is coupled to a first flow electrode 231 of third transistor 230. A second flow electrode 233 of third transistor 230 is coupled to a second supply voltage 206, in one embodiment ground.

As also shown in FIG. 2, improved high-speed domino logic circuit 200 includes fourth transistor 240, fifth transistor 270, and sixth transistor 280. As seen in FIG. 2, a first flow electrode 241 of fourth transistor 240 is coupled to first supply voltage 201 and the delayed clock signal CLKD is coupled to control electrode 245 of fourth transistor 240. Second flow electrode 243 of fourth transistor 240 is coupled to second node 295 and control electrode 225 of second transistor 220.

A first flow electrode of fifth transistor 270 is coupled to second node 295 and control electrode 225 of second transistor 220. The delayed clock signal CLKD is coupled to control electrode 275 of fifth transistor 270. A second flow electrode 273 is coupled a first flow electrode 283 of sixth transistor 280 and high speed domino logic circuit out terminal 251. a first flow electrode 281 of sixth transistor 280 is coupled to second node 295, control electrode 225 of second transistor 220 and first flow electrode 271 of fifth transistor 270. A control electrode 285 of sixth transistor 280 is coupled to the signal CLKDBAR.

Those of skill in the art will recognize that the pairing of fifth transistor 270 and sixth transistor 280 is utilized with the invention to avoid the decay of the digital "1" and digital "0" signals passed through the pair of fifth transistor 270 and sixth transistor 280. Those of skill in the art will also recognize that this pairing of fifth transistor 270 and sixth transistor 280 is not necessarily strictly required for proper operation of improved high speed domino logic circuit 200 and that, under certain circumstances, a single transistor could be employed.

As shown in FIG. 2, in one embodiment of the invention, first transistor 210, second transistor 220, fourth transistor 240, and sixth transistor 280 are PFETs, while third transistor 230 and fifth transistor 270 are NFETs. In this embodiment of the invention first supply voltage 210 is Vdd and second supply voltage 206 is ground. In addition, in this embodiment of the invention, first flow electrodes 211, 221, 231, 241, 271 and 283 are source electrodes and second flow electrodes 213, 223, 233, 243, 273 and 281 are drain electrodes. However, those of skill in the art will recognize that specific embodiments of improved high speed domino logic circuit 200 are shown in FIG. 2 with specific transistors for illustrative purposes only and that the NFETs and PFETS shown in the FIG. 2 can be readily exchanged for PFETs and NFETs by reversing the polarities of the supply voltages 201 and 206 or by other well known circuit modifications.

In operation, improved high-speed domino logic circuit 200 has two modes, or phases, of operation; a pre-charge phase and an evaluation phase. In one embodiment of improved high-speed domino logic circuit 200, in the initial pre-charge phase, the signal CLK is low or a digital "0". Consequently, first transistor 210 is conducting or "on"; second transistor 220 is on and third transistor 230 is off, thereby isolating logic block 203 from second supply voltage 206. In addition, during the pre-charge phase, first node 290 is high, or a digital "1", and this state is reinforced by second transistor 220 being in the on state. In addition, during the pre-charge phase, prior art domino logic circuit output terminal 252 is low or digital "0".

According to the invention, delayed clock signals CLKD and CLKDBAR are used in conjunction fourth transistor 240 and the combined pair of fifth and sixth transistors 270 and 280 to avoid the fight between node 290 and second transistor 220. As discussed in more detail below with respect to FIG. 3, delayed clock signal CLKD, according to the invention, remains a digital "0" for a programmed delay time and delayed clock signal CLKDBAR remains high for a programmed delay time while signal CLK immediately transitions to a digital "1". During this delay time between when signal CLK goes to a digital "1" and the delayed signals CLKD and CLKDBAR change state, third node 293 and the digital "1" on improved high-speed domino logic circuit out terminal 251 are isolated from second node 295 by the combined pair of fifth transistor 270 and sixth transistor 280 being off. At the same time, signal CLKD, still a digital "0", is coupled to control electrode 245 of fourth transistor 240 and transistor 240 conducts to drive node 295 to a digital "1". Node 295 is coupled to control electrode 225 of second transistor 220. The digital "1" on node 295 thus shuts off second transistor 220. Consequently, second transistor 220 does not resist, compete or "fight" the discharge of node 290 to a digital "0" when there is a path 291 from node 290 to second supply voltage 206 through logic block 203 and third transistor 230.

Since, as shown above, according to the invention, second transistor 220 does not resist, compete or "fight" the discharge of node 290 when there is a path 291 from node 290 to second supply voltage 206 through logic block 203 and third transistor 230, circuit designers are free to use larger and more powerful second transistors 220. This, in turn, means that the improved high-speed domino logic circuits 200, in contrast to prior art domino logic circuits, can be designed to have high noise immunity and increased speed.

When improved high-speed domino logic circuit out terminal 251 is a digital "0", i.e., when node 209 is a digital "1", then the combined pair of fifth transistor 270 and sixth transistor 280 are on and third node 293 and the digital "0" on improved high-speed domino logic circuit out terminal 251 is coupled directly to second node 295 and control electrode 225 of second transistor 220. Consequently, second transistor 220 conducts and improved high-speed domino logic circuit 200 operates in substantially the same manner as any other domino logic circuit.

FIG. 3 is a one embodiment of a timing diagram for the improved high-speed domino logic circuit of the invention shown in FIG. 3. Shown in FIG. 3 are: signal CLK 351; delayed signal CKLD 353; delayed signal CLKDBAR 355; signal 357, which is the signal on node 290 in FIG. 2; signal 359, which is the signal on node 295 in FIG. 2; and signal out 367, which is the signal on improved high-speed domino logic circuit out terminal 251 in FIG. 2.

In the discussion below, and in one embodiment of the invention, signal CLKDBAR 355 is one inverter delay later than signal CKLD 353, see FIG. 2 and element 268. However, as is well known to those of skill in the art, the transistors (not shown) making up the delay elements can be sized such that signal CLKDBAR 355 and CKLD 353 remain in phase as shown in FIG. 3.

As seen in FIG. 3, at time T0, i.e., point 301 and the beginning of a pre-charge phase, signal CLK 351 is low; signal CKLD 353 is high; signal CLKDBAR 355 is low; signal 357, which is the signal on node 290 in FIG. 2, is high; and signal 359, which is the signal on node 295 in FIG. 2 is low. Consequently, second transistor 220 of FIG. 2 is on, third transistor 230 of FIG. 2 is off, fourth transistor 240 of FIG. 2 is off, and signal out 367, which is the signal on improved high-speed domino logic circuit out terminal 251 in FIG. 2, is low.

At time T1, i.e., point 302 and the end of delay period 330 of the pre-charge phase, signal CLK 351 remains low; signal CKLD 353 transitions to low; signal CLKDBAR 355 transitions to high; signal 357, which is the signal on node 290 in FIG. 2 remains high; and signal 359, which is the signal on node 295 in FIG. 2 transitions to high. Consequently, second transistor 220 of FIG. 2 transitions off, third transistor 230 of FIG. 2 remains off, fourth transistor 240 of FIG. 2 transitions to on, and signal out 367, which is the signal on improved high-speed domino logic circuit out terminal 251 in FIG. 2, remains low.

At time T2, i.e., point 303 and the beginning of the transition delay period 331 from the pre-charge phase to the evaluation phase, signal CLK 351 transitions high; signal CKLD 353 remains low; signal CLKDBAR 355 remains high; signal 357, which is the signal on node 290 in FIG. 2 transitions low; and signal 359, which is the signal on node 295 in FIG. 2 remains high. Consequently, second transistor 220 of FIG. 2 remains off, third transistor 230 of FIG. 2 transitions to on, fourth transistor 240 of FIG. 2 remains on, and signal out 367, which is the signal on improved high-speed domino logic circuit out terminal 251 in FIG. 2 transitions to high after an inverter delay time T2A 304.

At time T3, i.e., point 305 and the end of the transition delay period 331 from the pre-charge phase to the evaluation phase, signal CLK 351 remains high; signal CKLD 353 transitions high; signal CLKDBAR 355 transitions low; signal 357, which is the signal on node 290 in FIG. 2 remains low; and signal 359, which is the signal on node 295 in FIG. 2 remains high. Consequently, second transistor 220 of FIG. 2 remains off, third transistor 230 of FIG. 2 remains on, fourth transistor 240 of FIG. 2 transitions off, and signal out 367, which is the signal on improved high-speed domino logic circuit out terminal 251 in FIG. 2 remains high.

Noteworthy is the fact that during transition delay time 331, signal CLK 351 switches to high, signal CLKD 353 remains low and signal CLKDBAR 355 remains high.

Consequently, as discussed above, according to the invention, delayed clock signals CLKD 353 and CLKDBAR 355 are used in conjunction fourth transistor 240 and the combined pair of fifth and sixth transistors 270 and 280 (FIG. 2) to avoid the fight between node 290 and second transistor 220. Since as shown in FIG. 3, the delayed clock signal CLKD 353, according to the invention, remains a digital "0" for a programmed delay time 331 and delayed clock signal CLKDBAR 355 remains high for a programmed delay time 331 while signal CLK 351 immediately transitions to a digital "1" at time T2, i.e., point 303 in FIG. 3. During this delay time 331 between when signal CLK 351 goes to a digital "1" and the delayed signals CLKD 353 and CLKDBAR 355 change state, third node 293 (FIG. 2), and the digital "1" on improved high-speed domino logic circuit out terminal 251 (signal 367 in FIG. 3), is isolated from second node 295 (FIG. 2) by the combined pair of fifth transistor 270 and sixth transistor 280 being off. At the same time, signal CLKD 351, still a digital "0", is coupled to control electrode 245 of fourth transistor 240 and transistor 240 conducts (see 365 in FIG. 3) to drive node 295 (signal 359 in FIG. 3) to a digital "1". Node 295 (FIG. 2) is coupled to control electrode 225 of second transistor 220. The digital "1" on node 295 thus shuts off second transistor 220 (see 361 in FIG. 3). Consequently, second transistor 220 does not resist, compete or "fight" the discharge of node 290 to a digital "0" when there is a path 291 from node 290 to second supply voltage 206 through logic block 203 and third transistor 230.

Since, as shown above, according to the invention, second transistor 220 does not resist, compete or "fight" the discharge of node 290 when there is a path 291 from node 290 to second supply voltage 206, through logic block 203 and third transistor 230, circuit designers are free to use larger and more powerful second transistors 220. This, in turn, means that the improved high-speed domino logic circuits 200, in contrast to prior art domino logic circuits, can be designed to have high noise immunity and increased speed.

At time T4, i.e., point 307 and the end of the evaluation phase, signal CLK 351 transitions low; signal CKLD 353 remains high; signal CLKDBAR 355 remains low; signal 357, which is the signal on node 290 in FIG. 2 transitions high; and signal 359, which is the signal on node 295 in FIG. 2 remains high. Consequently, second transistor 220 of FIG. 2 remains off, third transistor 230 of FIG. 2 transitions off, fourth transistor 240 of FIG. 2 remains off, and signal out 367, which is the signal on improved high-speed domino logic circuit out terminal 251 in FIG. 2 transitions low after an inverter delay T4A 308.

As discussed above, when the signal 367 on improved high-speed domino logic circuit out terminal 251 (FIG. 2) is a digital "0", i.e., when node 290 and signal 357 in FIG. 3 is a digital "1", then the combined pair of fifth transistor 270 and sixth transistor 280 (FIG. 2) are on and third node 293 and the digital "0" on improved high-speed domino logic circuit out terminal 251 is coupled directly to second node 295, signal 359 in FIG. 3, and control electrode 225 of second transistor 220 (FIG. 2). Consequently, second transistor 220 conducts, and improved high-speed domino logic circuit 200 (FIG. 2) operates in substantially the same manner as any other domino logic circuit.

In addition, the process discussed above will repeat for each switching of the system clock. Those of skill in the art will further recognize that the choice of signal highs and signal lows was made arbitrarily in FIG. 3 for illustrative purposes only and that at other times, and in other embodiments of the invention, signal highs could be replaced with signal lows and vice-versa.

As discussed above, the present invention is directed to a method and apparatus for creating an improved domino logic circuit that is capable of operation in both high speed and high noise environments.

Since, according to the invention, the second transistor does not resist, compete or "fight" the discharge of the first node when there is a path from the first node to the second supply voltage, through the logic block, circuit designers are free to use larger and more powerful second transistors. This, in turn, means that the improved high-speed domino logic circuits of the invention, in contrast to prior art domino logic circuits, can be designed to have high noise immunity and increased speed.

In addition, since according to the invention, only three new transistors are required, the modification of the invention is space efficient and readily incorporated into existing designs.

The foregoing description of an implementation of the invention has been presented for purposes of illustration and description only, and therefore is not exhaustive and does not limit the invention to the precise form disclosed. Modifications and variations are possible in light of the above teachings or may be acquired from practicing the invention.

For example, for illustrative purposes specific embodiments of the invention were shown with specific transistors. However, the NFETs and PFETS shown in the figures can be readily exchanged for PFETs and NFETs by reversing the polarities of the supply voltages or by other well known circuit modifications.

Consequently, the scope of the invention is defined by the claims and their equivalents.

What is claimed is:

1. An improved high-speed domino logic circuit comprising:
   a first supply voltage;
   a second supply voltage;
   a first clock signal;
   a second clock signal;
   an inverted second clock signal being approximately 180 degrees out of phase with said second clock signal;
   a first transistor, said first transistor comprising a first transistor first flow electrode, a first transistor second flow electrode and a first transistor control electrode, said first supply voltage being coupled to said first transistor first flow electrode, said first clock signal being coupled to said first transistor control electrode, said first transistor second flow electrode being coupled to a first node;
   a second transistor, said second transistor comprising a second transistor first flow electrode, a second transistor second flow electrode and a second transistor control electrode, said first supply voltage being coupled to said second transistor first flow electrode, said second transistor second flow electrode being coupled to said first node, said second transistor control electrode being coupled to a second node;
   a logic block coupled to said first node, said logic comprising at least one logic block input terminal and a logic block output terminal;
   a third transistor, said third transistor comprising a third transistor first flow electrode, a third transistor second flow electrode and a third transistor control electrode, said third transistor first flow electrode being coupled to said logic block output terminal, said third transistor second flow electrode being coupled to said second supply voltage, said third transistor control electrode being coupled to said first clock signal;
   a fourth transistor, said fourth transistor comprising a fourth transistor first flow electrode, a fourth transistor second flow electrode and a fourth transistor control electrode, said first supply voltage being coupled to said fourth transistor first flow electrode, said fourth transistor second flow electrode being coupled to said second node, said fourth transistor control electrode being coupled to said second clock signal;
   a fifth transistor, said fifth transistor comprising a fifth transistor first flow electrode, a fifth transistor second flow electrode and a fifth transistor control electrode, said fifth transistor first flow electrode being coupled to said second node, said fifth transistor second flow electrode being coupled to a third node which is an output terminal of said improved high-speed domino logic circuit, said fifth transistor control electrode being coupled to said second clock signal;
   a sixth transistor, said sixth transistor comprising a sixth transistor first flow electrode, a sixth transistor second flow electrode and a sixth transistor control electrode, said sixth transistor first flow electrode being coupled to said second node, said sixth transistor second flow electrode being coupled to said third node which is said output terminal of said improved high-speed domino logic circuit, said sixth transistor control electrode being coupled to said inverted second clock signal; and
   an inverter, said inverter comprising an inverter input terminal and an inverter output terminal, said inverter input terminal being coupled to said first node, said inverter output terminal being coupled to said third node which is said output terminal of said improved high-speed domino logic circuit, wherein
   said second clock signal is delayed with respect to said first clock signal.

2. The improved high-speed domino logic circuit of claim 1, wherein
   said logic block of said improved high-speed domino logic circuit comprises logic gates.

3. The improved high-speed domino logic circuit of claim 2, wherein
   said logic gates comprises an AND gate.

4. The improved high-speed domino logic circuit of claim 2, wherein
   said logic gates comprises an OR gate.

5. The improved high-speed domino logic circuit of claim 1, wherein
   said first supply voltage is Vdd and said second supply voltage is ground.

6. The improved high-speed domino logic circuit of claim 5, wherein
   said first transistor, said second transistor, said fourth transistor, and said sixth transistor are PFETs.

7. The improved high-speed domino logic circuit of claim 6, wherein
   said third transistor and said fifth transistor are NFETs.

8. An improved high-speed domino logic circuit comprising:
   a first supply voltage;
   a second supply voltage;
   a first clock signal;
   a second clock signal;
   an inverted second clock signal being approximately 180 degrees out of phase with said second clock signal;

a first PFET, said first PFET comprising a first PFET source electrode, a first PFET drain electrode and a first PFET gate electrode, said first supply voltage being coupled to said first PFET source electrode, said first clock signal being coupled to said first PFET gate electrode, said first PFET drain electrode being coupled to a first node;

a second PFET, said second PFET comprising a second PFET source electrode, a second PFET drain electrode and a second PFET gate electrode, said first supply voltage being coupled to said second PFET source electrode, said second PFET drain electrode being coupled to said first node, said second PFET gate electrode being coupled to a second node;

a logic block coupled to said first node, logic block comprising at least one logic block input terminal and a logic block output terminal;

a first NFET, said first NFET comprising a first NFET source electrode, a first NFET drain electrode and a first NFET gate electrode, said first NFET source electrode being coupled to said logic block output terminal, said first NFET drain electrode being coupled to said second supply voltage, said first NFET gate electrode being coupled to said first clock signal;

a third PFET, said third PFET comprising a third PFET source electrode, a third PFET drain electrode and a third PFET gate electrode, said first supply voltage being coupled to said third PFET source electrode, said third PFET drain electrode being coupled to said second node, said third PFET gate electrode being coupled to said second clock signal;

a second NFET, said second NFET comprising a second NFET source electrode, a second NFET drain electrode and a second NFET gate electrode, said second NFET source electrode being coupled to said second node, said second NFET drain electrode being coupled to a third node which is an output terminal of said improved high-speed domino logic circuit, said second NFET gate electrode being coupled to said second clock signal;

a fourth PFET, said fourth PFET comprising a fourth PFET source electrode, a fourth PFET drain electrode and a fourth PFET gate electrode, said fourth PFET source electrode being coupled to said second node, said fourth PFET drain electrode being coupled to said third node which is said output terminal of said improved high-speed domino logic circuit, said fourth PFET gate electrode being coupled to said inverted second clock signal; and an inverter, said inverter comprising an inverter input terminal and an inverter output terminal, said inverter input terminal being coupled to said first node, said inverter output terminal being coupled to said third node which is said output terminal of said improved high-speed domino logic circuit, wherein said second clock signal is delayed with respect to said first clock signal.

9. The improved high-speed domino logic circuit of claim 8, wherein said logic block of said improved high-speed domino logic circuit comprises logic gates.

10. The improved high-speed domino logic circuit of claim 9, wherein said logic gates comprises an AND gate.

11. The improved high-speed domino logic circuit of claim 9, wherein said logic gates comprises an OR gate.

12. The improved high-speed domino logic circuit of claim 8, wherein said first supply voltage is Vdd and said second supply voltage is ground.

* * * * *